United States Patent
Zhang

(10) Patent No.: US 6,507,531 B1
(45) Date of Patent: Jan. 14, 2003

(54) CACHE COLUMN MULTIPLEXING USING REDUNDANT FORM ADDRESSES

(75) Inventor: Kevin X. Zhang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/538,553

(22) Filed: Mar. 29, 2000

(51) Int. Cl.[7] ................................................ G11C 8/00
(52) U.S. Cl. .......................... 365/230.02; 365/230.06
(58) Field of Search ........................ 365/230.02, 230.06

(56) References Cited

U.S. PATENT DOCUMENTS

| | | | |
|---|---|---|---|
| 4,926,385 A | 5/1988 | Fujishima et al. | 365/230.03 |
| 4,804,871 A | 2/1989 | Walters, Jr. | 327/54 |
| 4,905,189 A | 2/1990 | Brunolli | 364/900 |
| 5,227,997 A | 5/1991 | Kikuda et al. | 365/189.08 |
| 5,315,558 A | 4/1993 | Hag | 365/189.04 |
| 5,257,236 A | 10/1993 | Sharp | 365/230.05 |
| 5,488,583 A | 9/1994 | Ong et al. | 365/201 |
| 5,568,442 A | 6/1995 | Kowalczyk et al. | 365/230.03 |
| 5,657,469 A | 10/1995 | Shimizu | 395/445 |
| 5,640,339 A | 3/1996 | Davis et al. | 365/63 |
| 5,657,281 A | 3/1996 | Mohan | 365/200 |
| 5,532,947 A | 7/1996 | Potter et al. | 708/200 |
| 5,956,274 A | 7/1996 | Elliot et al. | 365/189.02 |
| 5,555,529 A | 9/1996 | Hose, Jr. et al. | 365/230.06 |
| 5,583,806 A | 12/1996 | Widigen et al. | 708/708 |
| 5,920,515 A | 9/1997 | Shalik et al. | 365/200 |
| 5,680,569 A | 10/1997 | Correll | 395/427 |
| 5,710,731 A | 1/1998 | Ciraula et al. | 708/706 |
| 5,754,819 A | 5/1998 | Lynch et al. | 711/218 |
| 5,841,687 A | 11/1998 | Rees | 365/63 |
| 5,854,761 A | 12/1998 | Patel et al. | 365/49 |
| 5,860,092 A | 1/1999 | Breid et al. | 711/118 |
| 5,212,109 A | 8/1999 | Proebsting | 365/189.01 |
| 5,933,376 A * | 8/1999 | Lee | 365/200 |
| 5,970,912 A | 10/1999 | Martens et al. | 711/205 |
| 6,373,753 B1 | 2/2000 | Proebsting | 365/189.09 |
| 6,098,150 A | 8/2000 | Brethour et al. | 711/128 |
| 6,172,933 B1 | 1/2001 | Sager | 365/230.01 |
| 6,181,612 B1 * | 1/2001 | Wada | 365/189.1 |
| 6,373,758 B1 | 2/2001 | Hughes et al. | 365/200 |
| 6,209,076 B1 | 3/2001 | Blomgren | 711/214 |
| 6,212,109 B1 * | 4/2001 | Proebsting | 365/190 |
| 6,256,709 B1 | 7/2001 | Patel et al. | 711/128 |
| 6,341,327 B1 | 1/2002 | Sager | 711/108 |
| 6,356,485 B1 * | 3/2002 | Proebsting | 365/189.01 |
| 6,363,020 B1 * | 3/2002 | Shubat et al. | 365/200 |

OTHER PUBLICATIONS

Cortadella et al., "Evaluation of A+B=K Conditions Without Carry Propagation," IEEE Transactions on Computers, vol. 41, No. 11, pp. 1484–1488, Nov., 1992.

Heald et al., "Sum–Addressed–Memory Cache with 1.6ns Cycle and 2.6nc Latency," IEEE ISSCC, Paper SP 22.2, Feb. 7, 1998.

Cortadella et al., "Evaluation of A+B=K Conditions in Constant Time," IEEE ISSCC Paper SP 22.2, Feb. 7, 1998.

Lutz et al., "The Half–Adder Form and Early Branch Condition Resolution," IEEE ARITH'97, Jul. 6–9, 1997.

Lutz et al., "Early Zero Detection," IEEE ICCD'96, Oct. 7–9, 1996.

* cited by examiner

Primary Examiner—Michael S. Lebentritt
Assistant Examiner—Tuan T. Nguyen
(74) Attorney, Agent, or Firm—Blakely, Sokoloff, Taylor & Zafman LLP

(57) ABSTRACT

A method and apparatus uses possible wordline subsequence identifiers to multiplex columns for addresses received in redundant form, including addresses received from a bypass circuit. A cache wordline decoder uses carry-nonpropagative pre-decode circuitry to identify possible subsequences from redundant addresses. Identified subsequences are combined to identify wordline sequences and to activate corresponding wordline enable signals to access data stored in cache memory. A wordline may correspond to storage locations for multiple addresses. Identified possible subsequences are used to directly multiplex cache columns and the columns are organized so as to guarantee mutual exclusivity.

27 Claims, 17 Drawing Sheets

FIG. 10

| | $S_iC_{i-1}$ | $S_{i-1}C_{i-2}$ | | $R^{11}_i$ | $R^{01}_i$ | $R^{10}_i$ | $R^{00}$ |
|---|---|---|---|---|---|---|---|
| 1000 | 00 | 00 | → | 0 | 1 | 0 | 1 |
| 1001 | 00 | 01 | → | 0 | 1 | 1 | 0 |
| 1002 | 00 | 10 | → | 0 | 1 | 1 | 0 |
| 1003 | 00 | 11 | → | 1 | 0 | 1 | 0 |
| 1010 | 01 | 00 | → | 1 | 0 | 1 | 0 |
| 1011 | 01 | 01 | → | 1 | 0 | 0 | 1 |
| 1012 | 01 | 10 | → | 1 | 0 | 0 | 1 |
| 1013 | 01 | 11 | → | 0 | 1 | 0 | 1 |
| 1020 | 10 | 00 | → | 1 | 0 | 1 | 0 |
| 1021 | 10 | 01 | → | 1 | 0 | 0 | 1 |
| 1022 | 10 | 10 | → | 1 | 0 | 0 | 1 |
| 1023 | 10 | 11 | → | 0 | 1 | 0 | 1 |
| 1030 | 11 | 00 | → | 0 | 1 | 0 | 1 |
| 1031 | 11 | 01 | → | 0 | 1 | 1 | 0 |
| 1032 | 11 | 10 | → | 0 | 1 | 1 | 0 |
| 1033 | 11 | 11 | → | 1 | 0 | 1 | 0 |

CACHE COLUMN MULTIPLEXING USING REDUNDANT FORM ADDRESSES

RELATED APPLICATIONS

Application Ser. No. 09/532,411, titled "Shared Cache Wordline Decoder For Redundant and Regular Addresses," filed Mar. 22, 2000, pending. Application Ser. No. 09/887,870, titled "Tag Design For Cache Access With Redundant Form Address," filed Jun. 22, 2001, pending.

FIELD OF THE INVENTION

This invention relates generally to decoders for memory, and in particular to decoders for high-speed cache memory.

BACKGROUND OF THE INVENTION

A cache is a fast memory for storing copies of frequently accessed data. As processors become faster, cache access time is often a dominating factor in system performance. Conflicting goals face designers of cache memory systems. Smaller caches provide faster access times, but larger caches provide higher hit ratios thereby reducing penalties associated with accessing slower memory.

Two prior art methods are shown in U. S. Pat. No. 5,555,529. One typical prior art cache is shown in FIG. 1. A wordline decoder 30 receives an address to access memory array 32. Depending on the address, exactly one wordline, 60, 61, 62, 63, 64, or 65 is activated. For example, if wordline 60 is activated, then memory locations 50, 80, 85, and 90 will be accessed. When these memory locations are accessed, two bits of information at each memory location, 50, 80, 85, and 90 will be presented on a pair of bitlines, 35, 39, 41, and 45 to column multiplexers (MUXs) 99, 101, 103, and 105. This technique is known as column multiplexing. One bit from each pair will be selected by a column selector to be presented to the sense amplifiers 100, 102, 104, and 106. It should be noted that columns typically supply both true and complemented signal values for each bit stored at a memory location. Other column multiplexing schemes are in ratios of 4:1, 8:1 and 16:1, with 2:1 and 4:1 being most common. Advantages associated with column multiplexing include better area usage since memory read circuits and write circuits can be laid out using a wider pitch, and more room is provided for global routing over memory cells. Disadvantages include higher power usage and slower multiplexers for higher column multiplexing ratios.

A second prior art method is shown in FIG. 2. In this case, wordline decoder 125 activates either wordlines associated with array 120 or wordlines associated with array 122, but not both. If for example, wordline 130 is activated then bitline pairs 135, 137, 139 and 140 each supply one bit of information comprising both true and complemented signals to sense amplifiers 148, 144, 142, and 145. On the other hand, if wordline 150 is activated then bitline pairs 152, 155, 158 and 160 each supply one bit of information comprising both true and complemented signals to sense amplifiers 162, 164, 166, and 168. One advantage of this technique is that there is a power savings through discharging only the needed memory locations. Disadvantages include forcing a narrower pitch and greater probability of masked soft errors going undetected.

Another disadvantage with both of these prior methods involves computing large addresses. Since a current trend in processor design is to devote a substantial proportion of chip area to cache memory, much effort has been invested in improving access times for large caches. But for large addresses, the time it takes an adder to propagate a carry signal in computing the address is a significant factor.

In one prior art method, Cortadella et al ["Evaluation of A+B=K Conditions Without Carry Propagation," IEEE Transactions on Computers, vol. 41, pp. 1484–1488, November, 1992] show that an equality test does not require carry propagation. One representation of a sum A+B, which is suitable for use in a carry nonpropagative equality test, is known as half-adder or carry-sum form. The carry-sum representation uses a carry bit, $C_i$, and a sum bit, $S_i$, to represent a binary digit of a number in the ith digit position. In carry-sum form each number may have multiple valid representations. In a system of numbers, where each number is assigned multiple binary representations, the numbers are said to be in redundant form.

The carry-sum redundant form representation permits numbers to be added together while eliminating the need to propagate carry signals along the length of the address.

Another example, of a redundant form is called sign-digit. Each binary digit is represented as a sign bit, $X_{si}$, and a magnitude bit, $X_{mi}$, and can take on values of 1, 0, and −1.

Addresses can be calculated in carry-save or sign-digit redundant forms faster than through traditional adders, and wordline comparisons can be performed to access data without requiring carry propagation. Yet, techniques for cache column multiplexing based on specific address-bit values must be computed from redundant representations that are not unique. Therefore, computing column selectors may become a critical path in accessing cache.

BRIEF DESCRIPTION OF THE DRAWINGS

The present invention is illustrated by way of example and not limitation in the figures of the accompanying drawings.

FIG. 10 shows a truth table for generating possible subsequence indicators from carry-save redundant form address digits.

FIG. 11a shows a grouping of 4-bit addresses according to most significant 2-bit subsequences.

FIG. 11b shows a grouping of 4-bit addresses according to second most significant 2-bit subsequences.

DETAILED DESCRIPTION

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

For one embodiment a cache wordline decoder, herein described, provides carry-nonpropagative pre-decode circuitry to identify possible subsequences from redundant addresses. These identified subsequences are combined to identify wordline sequences and to activate corresponding wordline enable signals. The activated wordline enable signals are used to access data stored in cache memory at corresponding storage locations. A single wordline may correspond to storage locations for multiple addresses. Identified possible subsequences are used to directly multiplex cache columns and the columns are organized so as to guarantee mutual exclusivity.

For one embodiment, a cache column multiplexing technique, herein described, provides desirable features of column multiplexing and also of column segregation, while reducing undesirable features of both. Such a technique reduces power consumption by segregating columns according to wordlines, improves area usage by permitting memory read circuits and write circuits to be laid out using a wider pitch, and provides more room for global routing over memory cells. Soft error rates are reduced by the limiting proximity of same column storage cells. Column access speed is improved through reduced multiplexer sizes.

It will be appreciated that the techniques herein disclosed could also be used to access storage locations in forms of storage other than cache, including but not limited to dynamic, static, magnetic, read-only, volatile or non-volatile memories.

One method for quickly calculating addresses in a processor is to use a carry nonpropagative arithmetic circuit such as a carry-save adder to sum addressing components, possibly including a base address and an index or a displacement. Results from a carry-save adder can be bypassed to a load-store unit in redundant form, without waiting for carry propagation to complete. In order to access a cache using such an address, a cache wordline decoder for decoding addresses in a carry-sum redundant form is required.

Figure 1:
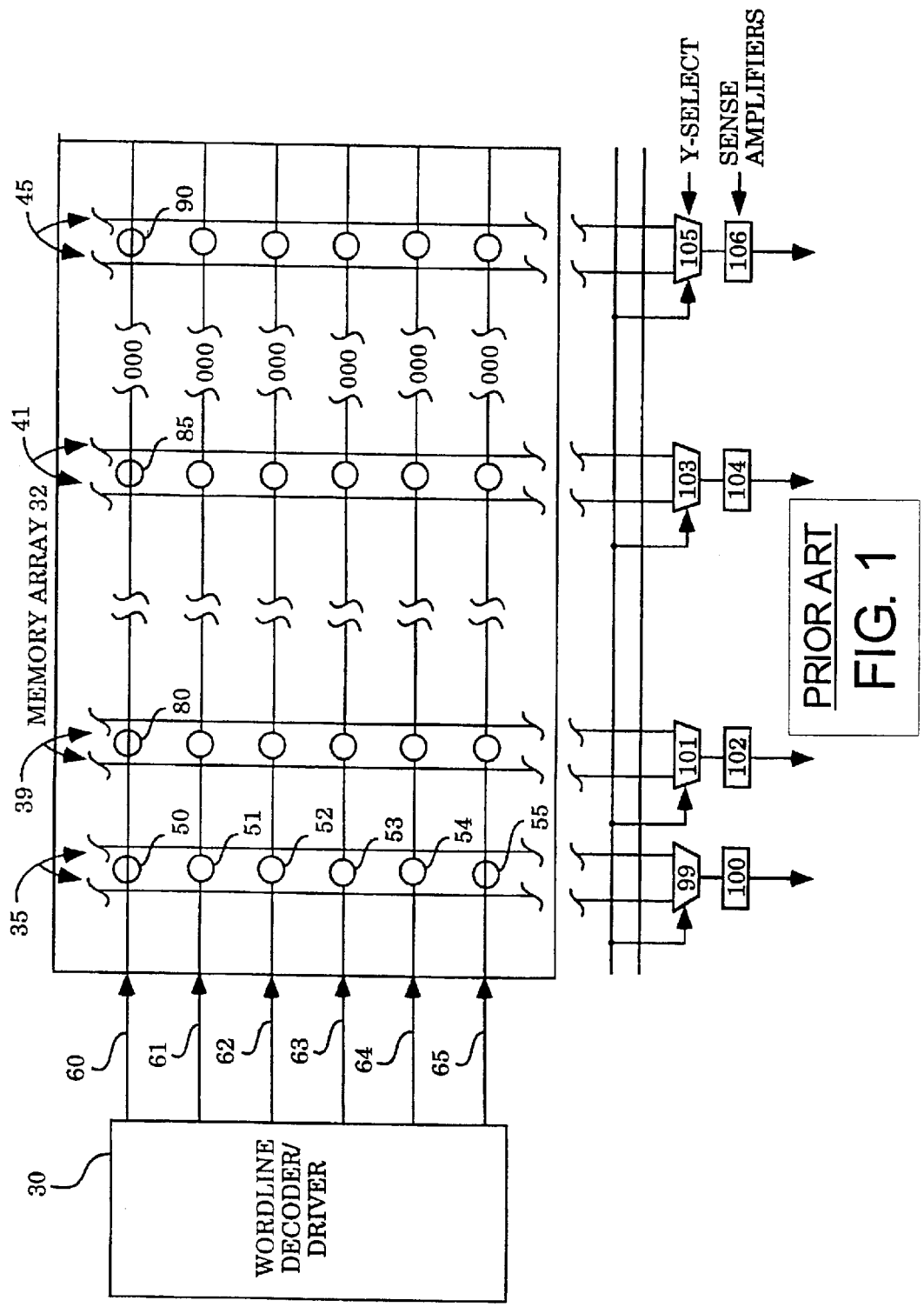
FIG. 1 shows a prior art odd-even cache column multiplexing technique.
Figure 2:
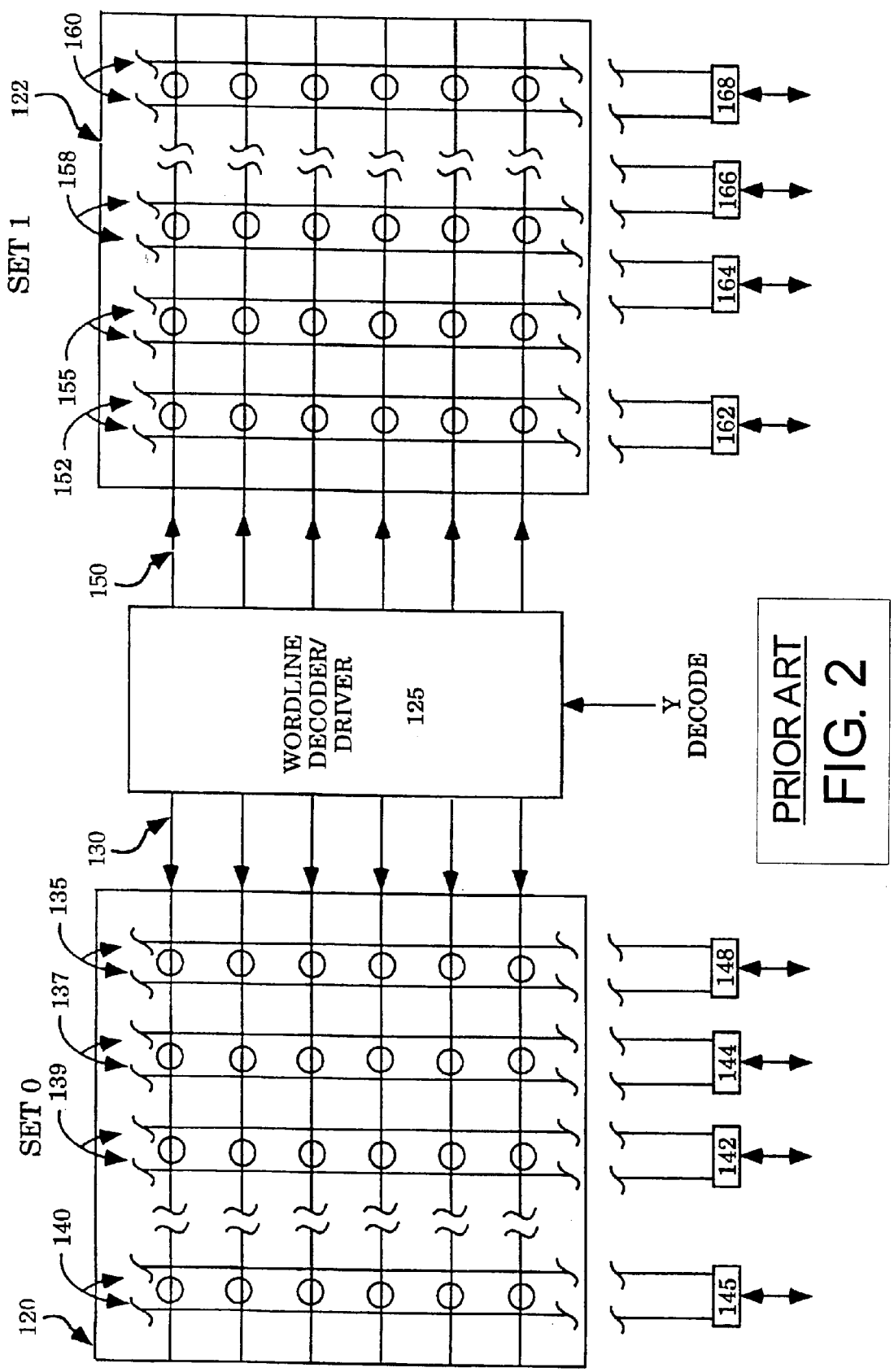
FIG. 2 shows a prior art odd-even cache column segregation technique.
Figure 3:
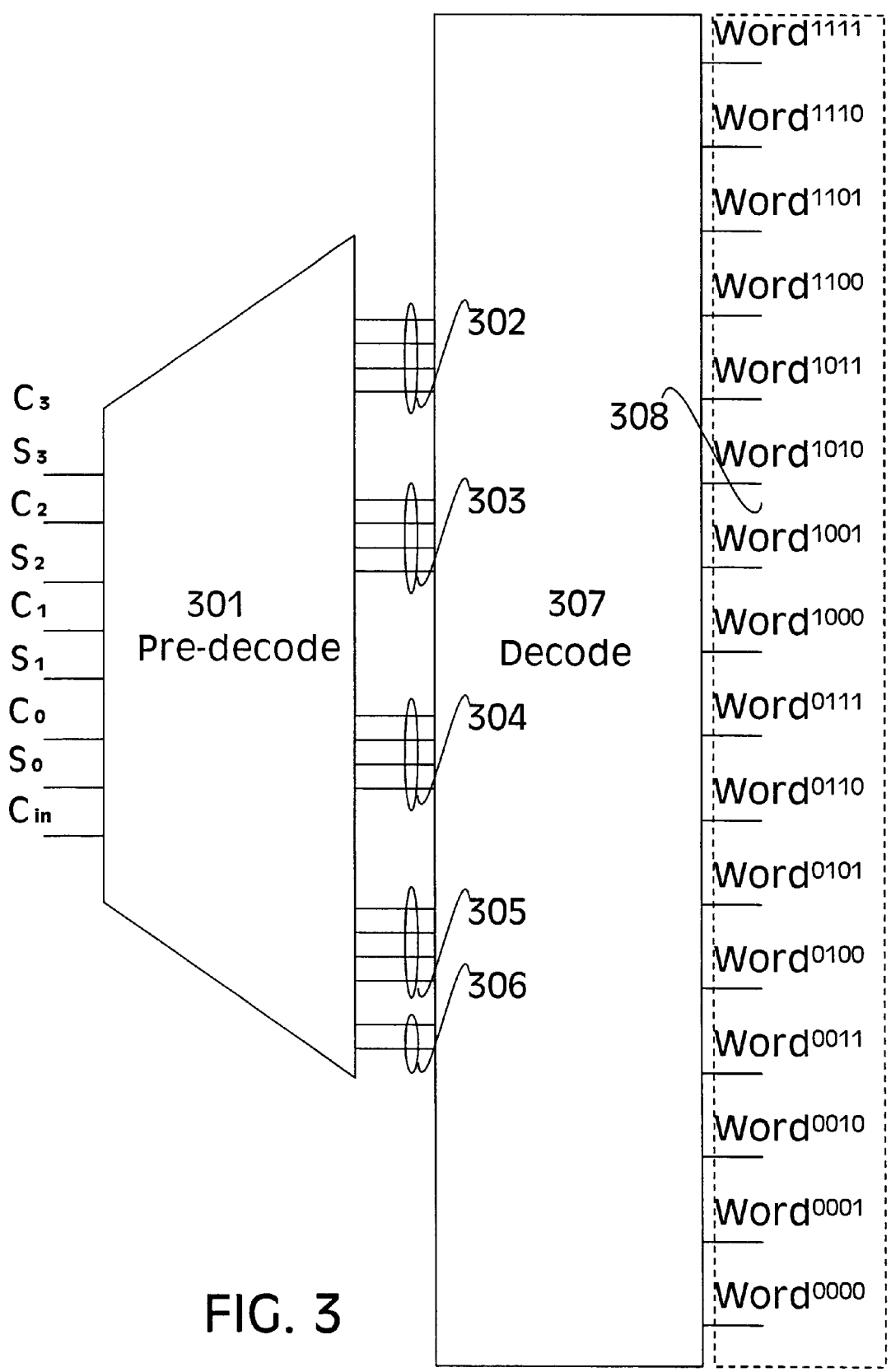
FIG. 3 shows a cache wordline decoder for decoding addresses in a carry-sum redundant form.

The type of cache wordline decoder required is depicted in FIG. 3. It accepts addresses in which the binary digits comprise carry bits, $C_i$, and sum bits, $S_i$, produced by a carry-save adder. In order to identify a corresponding wordline, Wordline$^i$, in cache memory, adjacent digits can first be pre-decoded by pre-decoder 301 to identify possible subsequences that could result from completion of carry propagation. According to the identified possible subsequences, subsequence indicators in subsequence indicator sets 302, 303, 304, and 305, 306 are activated. These subsequence indicators are combined in decoder 307 to identify a unique wordline sequence. According to the wordline sequence identified, one of a set of wordline indicators 308 is activated to access a corresponding location in cache.

Figure 4:
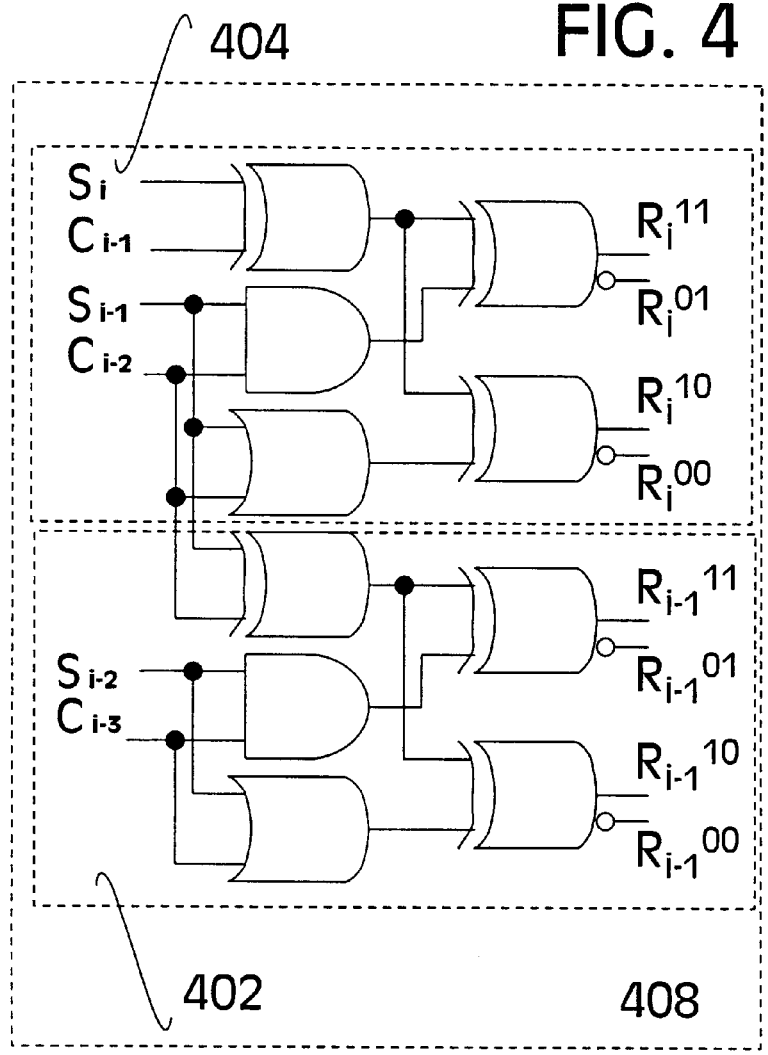
FIG. 4 shows one embodiment of a pre-decoder component circuit that accepts addresses in a carry-sum redundant form.

Identification of possible subsequences from carry-sum redundant digits can be accomplished using a circuit like the one shown in FIG. 4. This embodiment of a pre-decoder component circuit 408 comprises pre-decoder component circuit 404 and pre-decoder component circuit 402. Pre-decoder component circuit 404 accepts, sum bits, $S_i$ and $S_{i-1}$ and carry bits, $C_{i-1}$ and $C_{i-2}$, of an address in carry-sum redundant form and identifies possible two-bit subsequences that could result at positions, i and i–1 when the carry-sum address is converted into two's complement form. The identified possible subsequences are indicated by activating at least one of the four possible subsequence indicator signals, $R_i^{11}$, $R_i^{01}$, $R_i^{10}$ and $R_i^{00}$. Likewise, sum bits, $S_{i-1}$ and $S_{i-2}$, and carry bits, $C_{i-2}$ and $C_{i-3}$, can be used by pre-decoder component circuit 402 to identify possible two-bit subsequences that could result at positions, i–1 and i–2 when the address is converted to two's complement. The possible subsequences are indicated by activating at least one of the four possible subsequence indicator signals, $R_{i-1}^{11}$, $R_{i-1}^{01}$, $R_{i-1}^{10}$, $R_{i-1}^{00}$.

As shown in FIG. 4, the afore mentioned possible subsequence indicator signals (as shown in pre-decoder component circuit 404) for a subsequence with most significant bit at position, i, in a wordline sequence are activated according to the following logic equations or their equivalents:

$$R_i^{11} = (S_{i-1} \text{ AND } C_{i-2}) \text{ XOR } (S_i \text{ XOR } C_{i-1}),$$

$$R_i^{01} = (S_{i-1} \text{ AND } C_{i-2}) \text{ XNOR } (S_i \text{ XOR } C_{i-1}),$$

$$R_i^{10} = (S_{i-1} \text{ OR } C_{i-2}) \text{ XOR } (S_i \text{ XOR } C_{i-1}),$$

and $$R_i^{00} = (S_{i-1} \text{ OR } C_{i-2}) \text{ XNOR } (S_i \text{ XOR } C_{i-1}).$$

Figure 5:
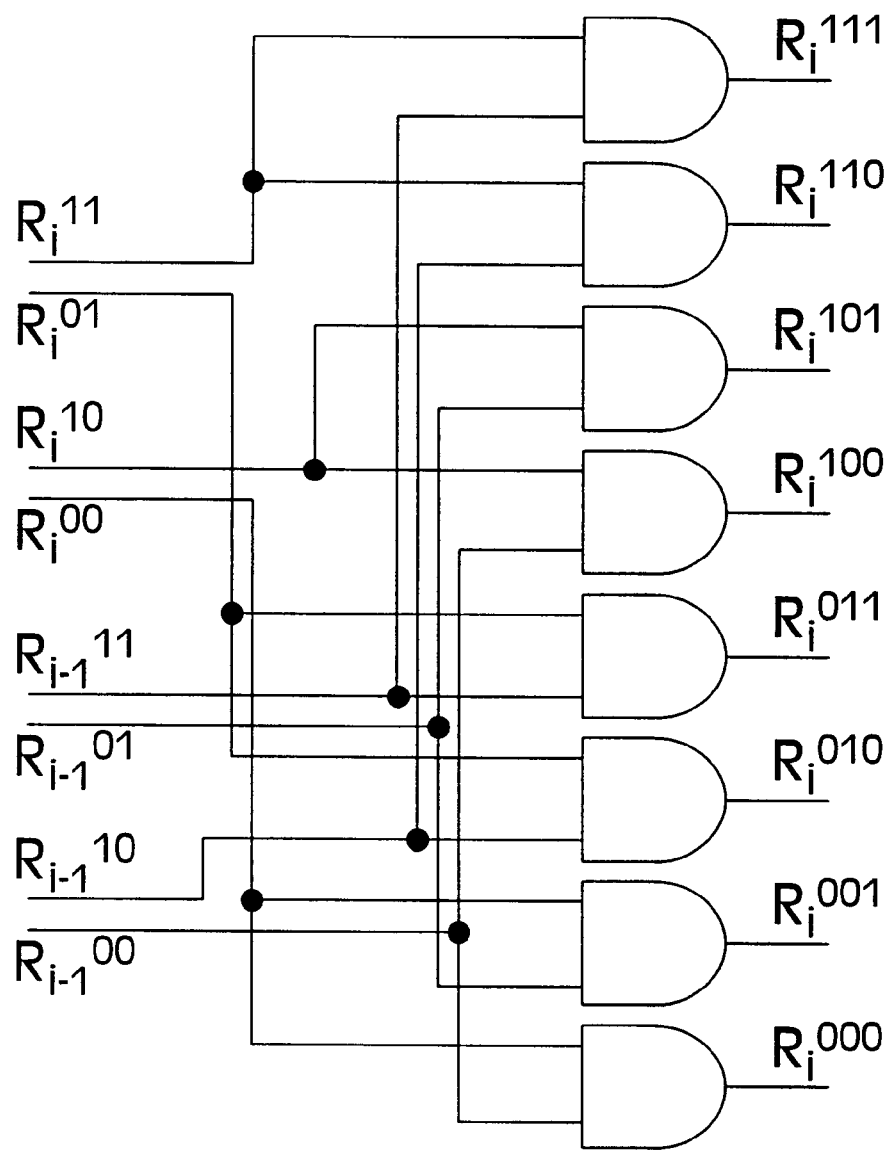
FIG. 5 shows one embodiment of a decoder component circuit that combines two-bit subsequences into three-bit subsequences.

The possible three-bit subsequences ending at position, i, can be identified by combining possible two-bit sequences ending at position, i, with the possible two-bit subsequences ending at position, i–1. FIG. 5 shows one embodiment of a decoder component circuit that combines two-bit subsequences into three-bit subsequences in this manner. It should be noted, of course, that one skilled in the art could modify the pre-decoder illustrated in FIG. 4 directly identify possible three-bit subsequences, or to identify possible four-bit subsequences, or to identify possible subsequences of any other size.

As shown in FIG. 5, a 3-bit possible subsequence indicator for a subsequence with most significant bit at position, i, in a wordline sequence is activated according to the following logic equations or their equivalents:

$$R_i^{111} = R_i^{11} \text{ AND } R_{i-1}^{11},$$

$$R_i^{110} = R_i^{11} \text{ AND } R_{i-1}^{10},$$

$$R_i^{101} = R_i^{10} \text{ AND } R_{i-1}^{01},$$

$$R_i^{100} = R_i^{10} \text{ AND } R_{i-1}^{00},$$

$$R_i^{011} = R_i^{01} \text{ AND } R_{i-1}^{11},$$

$$R_i^{010} = R_i^{01} \text{ AND } R_{i-1}^{10},$$

$$R_i^{001} = R_i^{00} \text{ AND } R_{i-1}^{01},$$

and $$R_i^{000} = R_i^{00} \text{ AND } R_{i-1}^{00}.$$

In a like manner, longer possible subsequences could be identified by ANDing together additional shorter possible subsequences.

Figure 6:
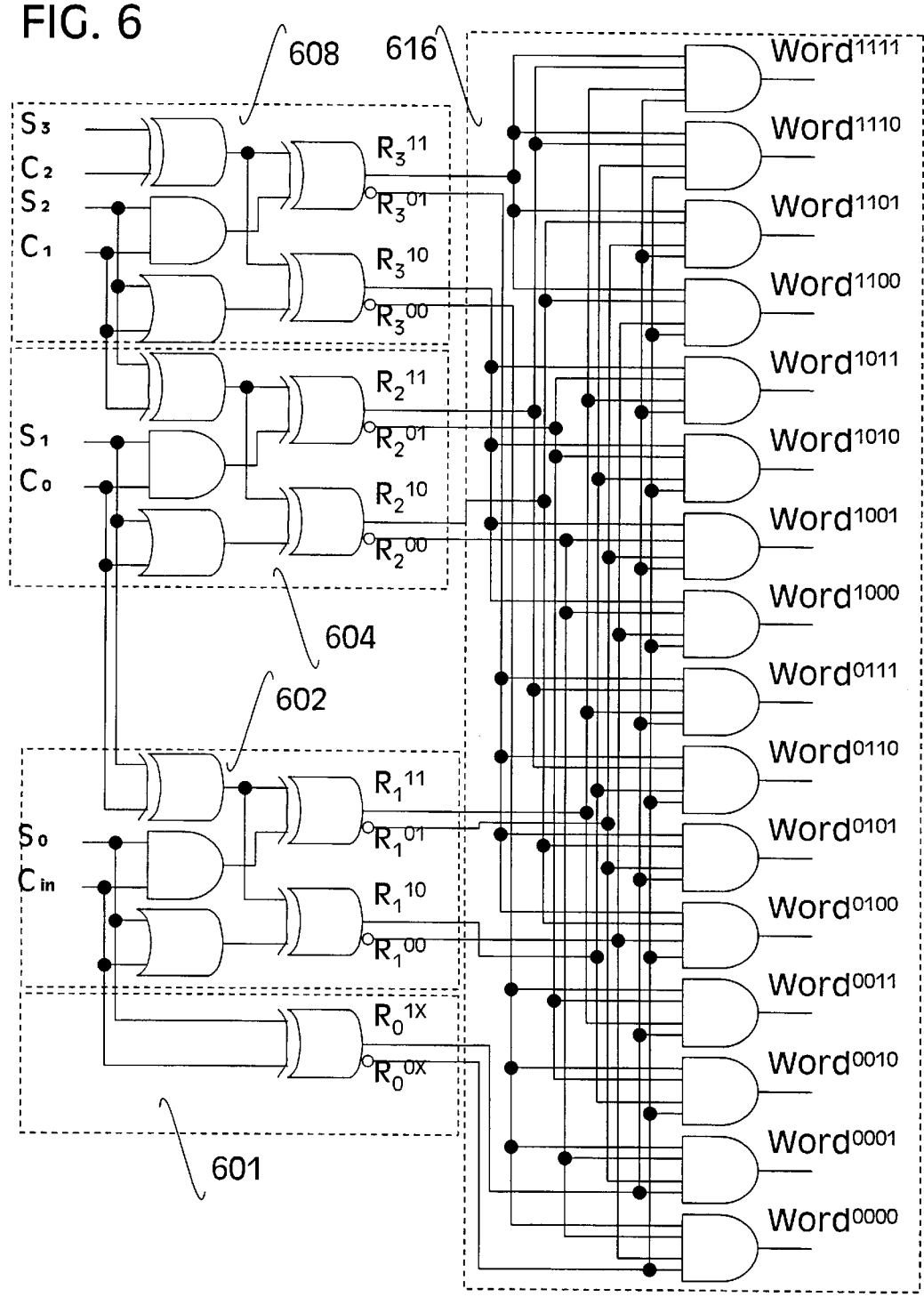
FIG. 6 details one embodiment of a cache wordline decoder for decoding four-digit addresses in a carry-sum redundant form.

One embodiment of a cache wordline decoder for decoding four-digit binary addresses in a carry-sum redundant form is illustrated in FIG. 6. Through combining the possible two-bit subsequences ending at position, i, identified by pre-decoder component circuit 608; position i−1, identified by pre-decoder component circuit 604; and position i−2, identified by pre-decoder component circuit 602; position with the one-bit possibilities for the least significant position, identified by pre-decoder component circuit 601 the unique four-bit wordline corresponding to the carry-sum redundant address can be identified without requiring carry propagation.

A unique wordline indicator for a 4-bit wordline sequence is activated by decoder 616 according to the following logic equations or their equivalents:

$$\text{Word}^{1111} = R_3^{11} \text{ AND } R_2^{11} \text{ AND } R_1^{11} \text{ AND } R_0^{1X},$$

$$\text{Word}^{1110} = R_3^{11} \text{ AND } R_2^{11} \text{ AND } R_1^{10} \text{ AND } R_0^{0X},$$

$$\text{Word}^{1101} = R_3^{11} \text{ AND } R_2^{10} \text{ AND } R_1^{01} \text{ AND } R_0^{1X},$$

$$\text{Word}^{1100} = R_3^{11} \text{ AND } R_2^{10} \text{ AND } R_1^{00} \text{ AND } R_0^{0X},$$

$$\text{Word}^{1011} = R_3^{10} \text{ AND } R_2^{01} \text{ AND } R_1^{11} \text{ AND } R_0^{1X},$$

$$\text{Word}^{1010} = R_3^{10} \text{ AND } R_2^{01} \text{ AND } R_1^{10} \text{ AND } R_0^{0X},$$

$$\text{Word}^{1001} = R_3^{10} \text{ AND } R_2^{00} \text{ AND } R_1^{01} \text{ AND } R_0^{1X},$$

$$\text{Word}^{1000} = R_3^{10} \text{ AND } R_2^{00} \text{ AND } R_1^{00} \text{ AND } R_0^{0X},$$

$$\text{Word}^{0111} = R_3^{01} \text{ AND } R_2^{11} \text{ AND } R_1^{11} \text{ AND } R_0^{1X},$$

$$\text{Word}^{0110} = R_3^{01} \text{ AND } R_2^{11} \text{ AND } R_1^{10} \text{ AND } R_0^{0X},$$

$$\text{Word}^{0101} = R_3^{01} \text{ AND } R_2^{10} \text{ AND } R_1^{01} \text{ AND } R_0^{1X},$$

$$\text{Word}^{0100} = R_3^{01} \text{ AND } R_2^{10} \text{ AND } R_1^{00} \text{ AND } R_0^{0X},$$

$$\text{Word}^{0011} = R_3^{00} \text{ AND } R_2^{01} \text{ AND } R_1^{11} \text{ AND } R_0^{1X},$$

$$\text{Word}^{0010} = R_3^{00} \text{ AND } R_2^{01} \text{ AND } R_1^{10} \text{ AND } R_0^{0X},$$

$$\text{Word}^{0001} = R_3^{00} \text{ AND } R_2^{00} \text{ AND } R_1^{01} \text{ AND } R_0^{1X},$$

and $$\text{Word}^{0000} = R_3^{00} \text{ AND } R_2^{00} \text{ AND } R_1^{00} \text{ AND } R_0^{0X}.$$

Figure 7A:
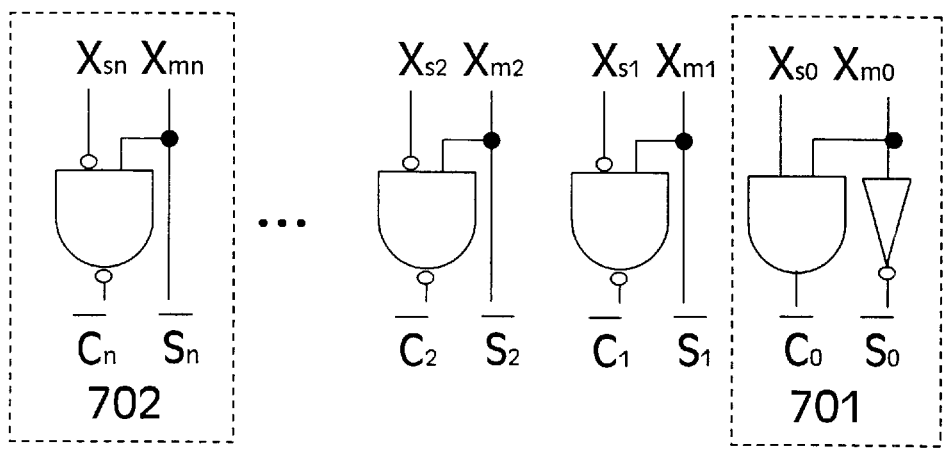
FIG. 7a shows one embodiment of circuit that accepts addresses in a sign-digit redundant form and provides addresses in a negated carry-sum redundant form.

Another redundant representation used to quickly calculate load addresses without carry propagation is the sign-digit redundant form. In the sign-digit redundant form, each digit is represented by sign bit, $X_{si}$, and a magnitude bit, $X_{mi}$. FIG. 7a shows one embodiment of circuit that accepts addresses in a sign-digit redundant form and produces addresses in a negated carry-sum redundant form.

Figure 7B:
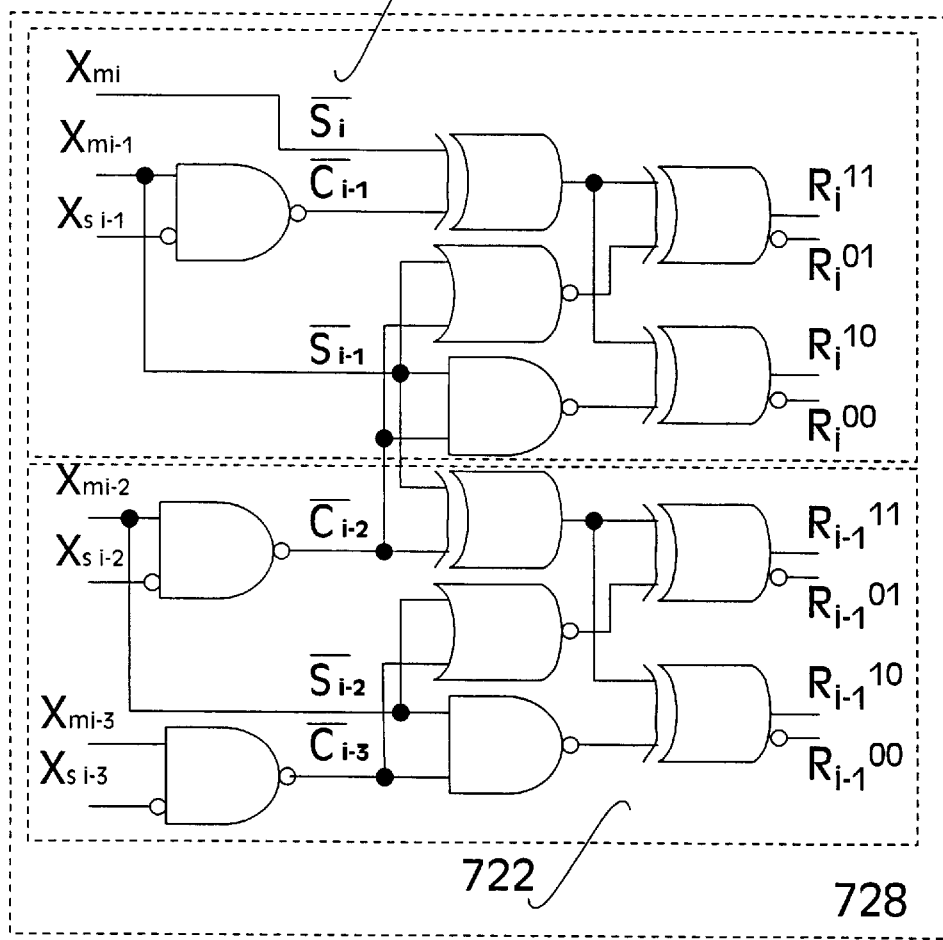
FIG. 7b shows one embodiment of a pre-decoder component circuit that accepts addresses in a sign-digit redundant form.

Identification of possible subsequences from sign-digit redundant digits can be accomplished using a circuit like the one shown in FIG. 7b. This embodiment of a pre-decoder component circuit 728 comprises pre-decoder component circuit 724 and pre-decoder component circuit 722. Pre-decoder component circuit 724 accepts, sign bits, $X_{si-1}$, and $X_{si-2}$, magnitude bits, $X_{mi}$, $X_{mi-1}$ and $X_{mi-2}$ of an address in sign-digit redundant form and identifies possible two-bit subsequences that could result at positions, i and i−1 when the sign-digit address is converted into two's complement form. The identified possible subsequences are indicated by activating at least one of the four possible subsequence indicator signals, $R_i^{11}$, $R_i^{01}$, $R_i^{10}$ and $R_i^{00}$. Likewise, sign bits, $X_{si-2}$, and $X_{si-3}$, and magnitude bits, $X_{mi-1}$, $X_{mi-2}$ and $X_{mi-3}$, can be used by pre-decoder component circuit 722 to identify possible two-bit subsequences that could result at positions, i−1 and i−2 when the address is converted to two's complement. The possible subsequences are indicated by activating at least one of the four possible subsequence indicator signals, $R_{i-1}^{11}$, $R_{i-1}^{01}$, $R_{i-1}^{10}$, $R_{i-1}^{00}$.

As shown in FIG. 4, the afore mentioned possible subsequence indicator signals (as shown in pre-decoder component circuit 724) for a subsequence with most significant bit at position, i, in a wordline sequence are activated according to the following logic equations or their equivalents:

$$R_i^{11} = (X_{mi-1} \text{ NOR } (X_{mi-2} \text{ NAND NOT } X_{si-2})) \text{ XOR } (X_{mi} \text{ XOR } (X_{mi-1} \text{ NAND NOT } X_{si-1})),$$

$$R_i^{01} = \text{NOT } (X_{mi-1} \text{ NOR } (X_{mi-2} \text{ NAND NOT } X_{si-2})) \text{ XOR } (X_{mi} \text{ XOR } (X_{mi-1} \text{ NAND NOT } X_{si-1})),$$

$$R_i^{10} = (X_{mi-1} \text{ NAND } (X_{mi-2} \text{ NAND NOT } X_{si-2})) \text{ XOR } (X_{mi} \text{ XOR } (X_{mi-1} \text{ NAND NOT } X_{si-1})),$$

$$R_i^{00} = \text{NOT } (X_{mi-1} \text{ NAND } (X_{mi-2} \text{ NAND NOT } X_{si-2})) \text{ XOR } (X_{mi} \text{ XOR } (X_{mi-1} \text{ NAND NOT } X_{si-1})),$$

Figure 8:
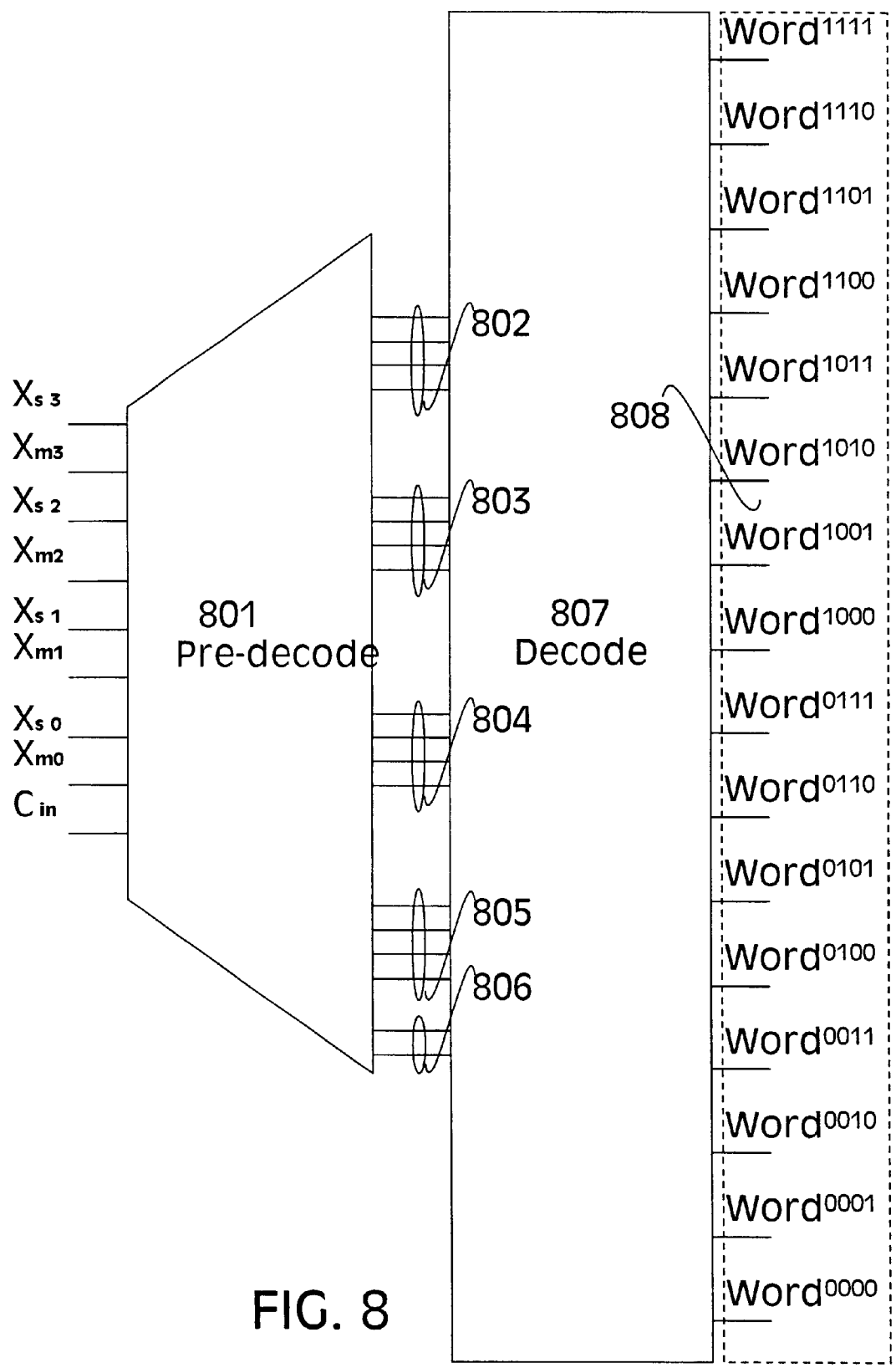
FIG. 8 shows one embodiment of a cache wordline decoder for sign-digit redundant addresses.

FIG. 8 shows one embodiment of a cache wordline decoder for sign-digit redundant addresses. It accepts addresses in which the binary digits comprise sign bits, $X_{si}$, and magnitude bits, $X_{mi}$, produced by a carry-save adder. In order to identify a corresponding wordline, Wordline$^i$, in cache memory, adjacent digits can first be pre-decoded by pre-decoder 801 to identify possible subsequences that could result from completion of carry propagation. According to the identified possible subsequences, subsequence indicators in subsequence indicator sets 802, 803, 804, and 805, 806 are activated. These subsequence indicators are combined in decoder 807 to identify a unique wordline sequence. According to the wordline sequence identified, one of a set of wordline indicators 808 is activated to access a corresponding location in cache.

There are advantages associated with column multiplexing including better area usage since memory read circuits and write circuits can be laid out using a wider pitch, and more room is provided for global routing over memory cells. Soft error rates are reduced by limiting proximity of same column storage cells. There are also advantages associated with column segregation. The technique reduces power consumption and decoder sizes. A straight forward scheme for generating column selector signals for redundant addresses is to propagate carry signals to a desired position and identify a true bit value at that position then to combine enough possible subsequences indicators with the identified true bit value to completely decode a subsequence of the wordline.

Figure 9A:
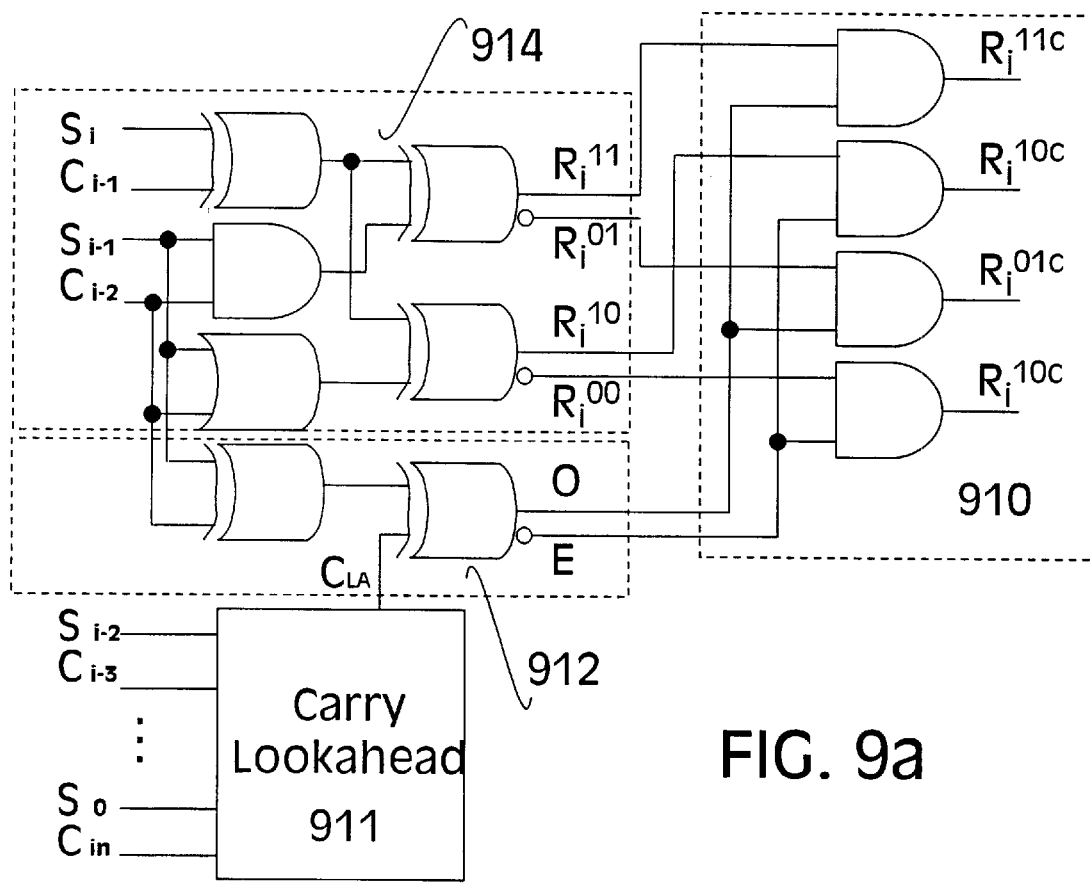
FIG. 9a shows a circuit for generating four column selectors from carry-sum redundant form addresses using a carry lookahead circuit.

FIG. 9a shows a circuit for generating four column selectors 910 from carry-sum redundant form addresses using a carry lookahead circuit 911. Carry lookahead circuit 911 accepts, sum bits, $S_{i-2}$ through $S_0$, and carry bits, $C_{i-3}$ through $C_{in}$, of an address in carry-sum redundant form and propagates carry signals to generate a carry output signal, $C_{LA}$, for position, i−2. Pre-decoder component circuit 914 accepts, sum bits, $S_i$ and $S_{i-1}$, and carry bits, $C_{i-1}$, and $C_{i-2}$, of an address in carry-sum redundant form and identifies possible two-bit subsequences that could result at positions, i and i−1 when the carry-sum address is converted into two's complement form. The identified possible subsequences are indicated by activating at least one of the four possible subsequence indicator signals, $R_i^{11}$, $R_i^{01}$, $R_i^{10}$ and $R_i^{00}$. Pre-decoder component circuit 912 accepts, sum bit, $S_{i-1}$, carry bit, $C_{i-2}$, of an address in carry-sum redundant form and a carry-lookahead carry signal $C_{LA}$. It identifies a true two-bit subsequence at positions, i and i−1. The identified subsequence are indicated by activating exactly one of the four column selector signals, $R_i^{11c}$, $R_i^{01c}$, $R_i^{10c}$, and $R_i^{00c}$.

Figure 9B:
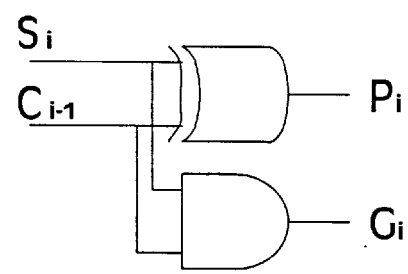
FIG. 9b shows a half adder circuit for generating carry propagate and carry generate signals from carry-sum redundant form address digits.

FIG. 9b shows a half adder circuit for generating carry propagate, $P_i$, and carry generate signals, $G_i$, from carry-sum redundant form address digits, $S_i$ and $C_{i-1}$, according to the following logic equations or their equivalents:

$$P_i = S_i \text{ XOR } C_{i-1}$$

and $$G_i = S_i \text{ AND } C_{i-1}.$$

Figure 9C:
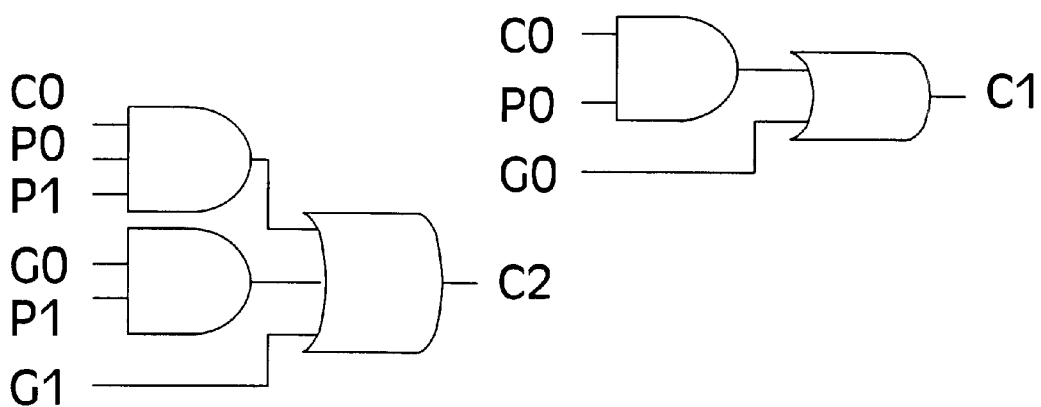
FIG. 9c shows circuits for generating carry out signals from carry-propagate and carry generate signals.
Figure 9C:
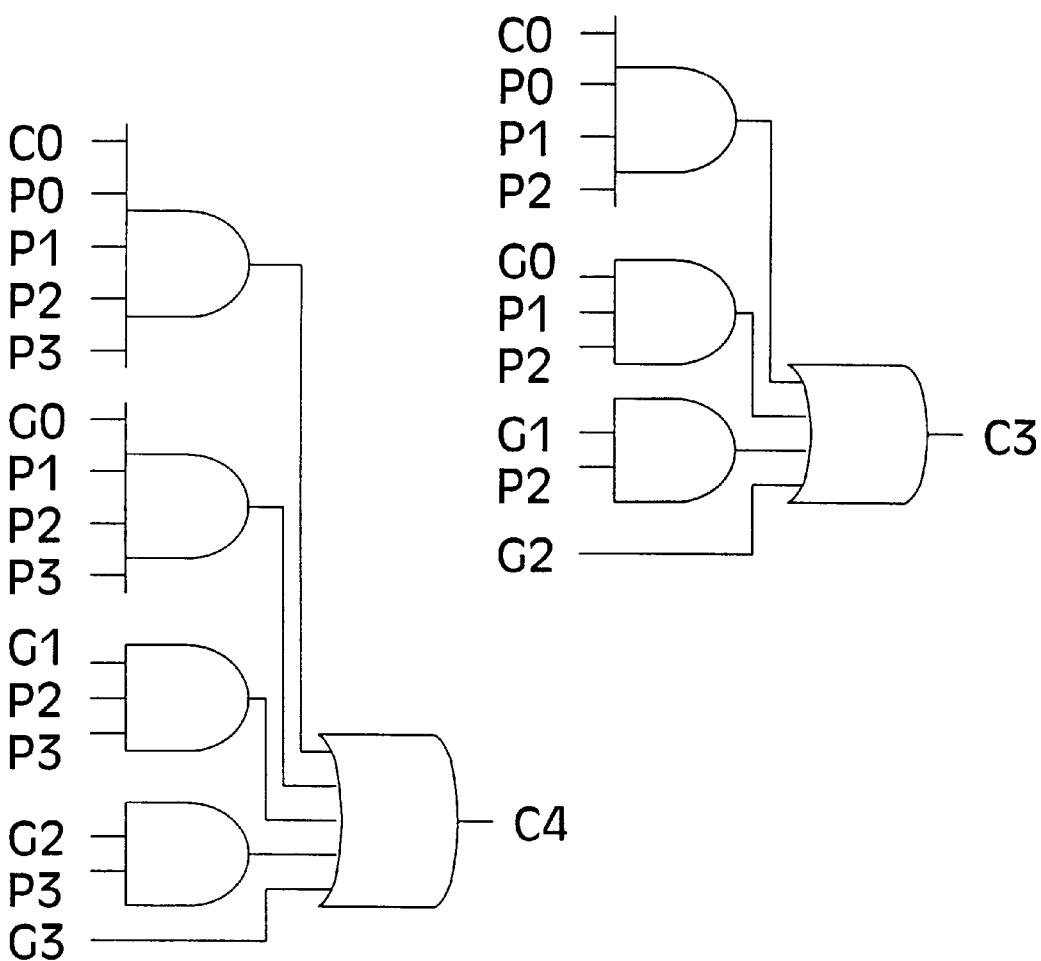

FIG. 9c shows carry lookahead circuits for generating a carry out signal, $C_i$, from carry-propagate signals, $P_0$ through $P_{i-1}$, and carry generate signals, $G_0$ through $G_{i-1}$, and carry input signal, $C_0$, according to the following logic equations or their equivalents:

$$C_1 = (C_0 \text{ AND } P_0) \text{ OR } G_0.$$

$$C_2 = (C_0 \text{ AND } P_0 \text{ AND } P_1) \text{ OR } (G_0 \text{ AND } P_1) \text{ OR } G_1,$$

$$C_3 = (C_0 \text{ AND } P_0 \text{ AND } P_1 \text{ AND } P_2) \text{ OR } (G_0 \text{ AND } P_1 \text{ AND } P_2) \text{ OR } (G_1 \text{ AND } P_2) \text{ OR } G_2,$$

$$C_4 = (C_0 \text{ AND } P_0 \text{ AND } P_1 \text{ AND } P_2 \text{ AND } P_3) \text{ OR } (G_0 \text{ AND } P_1 \text{ AND } P_2 \text{ AND } P_3) \text{ OR } (G_1 \text{ AND } P_2 \text{ AND } P_3) \text{ OR } (G_2 \text{ AND } P_3) \text{ OR } G_3,$$

One problem with this approach is that it may reduce the benefits of using nonpropagative circuitry to calculate addresses and decode wordlines by requiring carry propagation to generate column selector signals. It is also limited to the less significant address positions as more significant positions require longer carry propagation delays. Since access speed is crucial to cache design, a better column multiplexing scheme is desired for redundant addresses.

The truth table shown in FIG. 10 is for generating possible subsequence indicators from carry-save redundant form address digits. A similar table can be drawn for sign-digit addresses. It can be noticed that adjacent pairs of possible subsequence indicators ($R_i^{11}$, $R_i^{01}$) and ($R_i^{10}$, $R_i^{00}$) are mutually exclusive. For example line 1000 shows that if $S_i=0$, $C_{i-1}=0$, $S_{i-1}=0$, and $C_{i-2}=0$; then $R_i^{11}=0$, $R_i^{01}=1$, $R_i^{10}=0$, and $R_i^{00}=1$. Similarly for line 1001, if $S_i=0$, $C_{i-1}=0$, $S_{i-1}=0$, and $C_{i-2}=1$; then $R_i^{11}=0$, $R_i^{01}=1$, $R_i^{10}=1$, and $R_i^{00}=0$. Like patterns are shown for the remaining lines 1002–1033. Hence $R_i^{11}$ is never equal to $R_i^{01}$ and $R_i^{10}$ is never equal to $R_i^{00}$. Further it can be noticed that an address having an active possible subsequence indicator $R_i^{11}$ could share a wordline with an address having an active possible subsequence indicator $R_i^{01}$ and an address having an active possible subsequence indicator $R_i^{10}$ could share a wordline with an address having an active possible subsequence indicator $R_i^{00}$. This can be seen in FIG. 11a.

FIG. 11a shows a grouping of 4-bit addresses according to most significant 2-bit subsequences. Since the sequences shown in block 1110 have corresponding sequences in block 1112, these addresses could be permitted to share a word line generated by the three least significant bits, if the column was selected by the most significant active possible subsequence indicator. Similarly, since the sequences shown in block 1111 have corresponding sequences in block 1113, these addresses could be permitted to share a word line generated by the three least significant bits, if the column was selected by the most significant active possible subsequence indicator. Further, since a single unique wordline will be activated, there is no danger of contention between block 1110 and block 1111 for example, or between block 1112 and block 1113. It can also be noticed that similar conditions exist for digit positions other than the most significant digit position.

For instance, FIG. 11b shows another grouping of 4-bit addresses according to second most significant 2-bit subsequences. Since the sequences shown in blocks 1120 have corresponding sequences in blocks 1122, these addresses could be permitted to share a word line generated by the most significant bit and the two least significant bits, if the column was selected by the second most significant active possible subsequence indicator. Similarly, since the sequences shown in blocks 1121 have corresponding sequences in blocks 1123, these addresses could be permitted to share a word line generated by the most significant bit and the two least significant bits, if the column was selected by the second most significant active possible subsequence indicator.

Such a wordline could be generated, for example, by combining $R_3^{11}$ and $R_i^{10}$ through an OR gate prior to decoding through a circuit like the one shown in FIG. 5. Similarly $R_3^{01}$ and $R_3^{00}$ could be combined through an OR gate prior to decoding through a circuit like the one shown in FIG. 5. This guarantees the activation of a unique wordline. Of course, it will be appreciated that one skilled in the art may select to implement such a wordline decoder in a variety of ways, some providing reductions in required circuitry when compared to a literal implementation of the solution disclosed above.

As before, since a single unique wordline is activated, there is no danger of contention between blocks 1120 and blocks 1121 for example, or between blocks 1122 and blocks 1123. Hence, an address space may be divided into four quarters according to possible subsequence indicators and these four quarters may be multiplexed by directly using possible subsequence indicators as column selectors. This is illustrated in FIG. 12.

Figure 12:
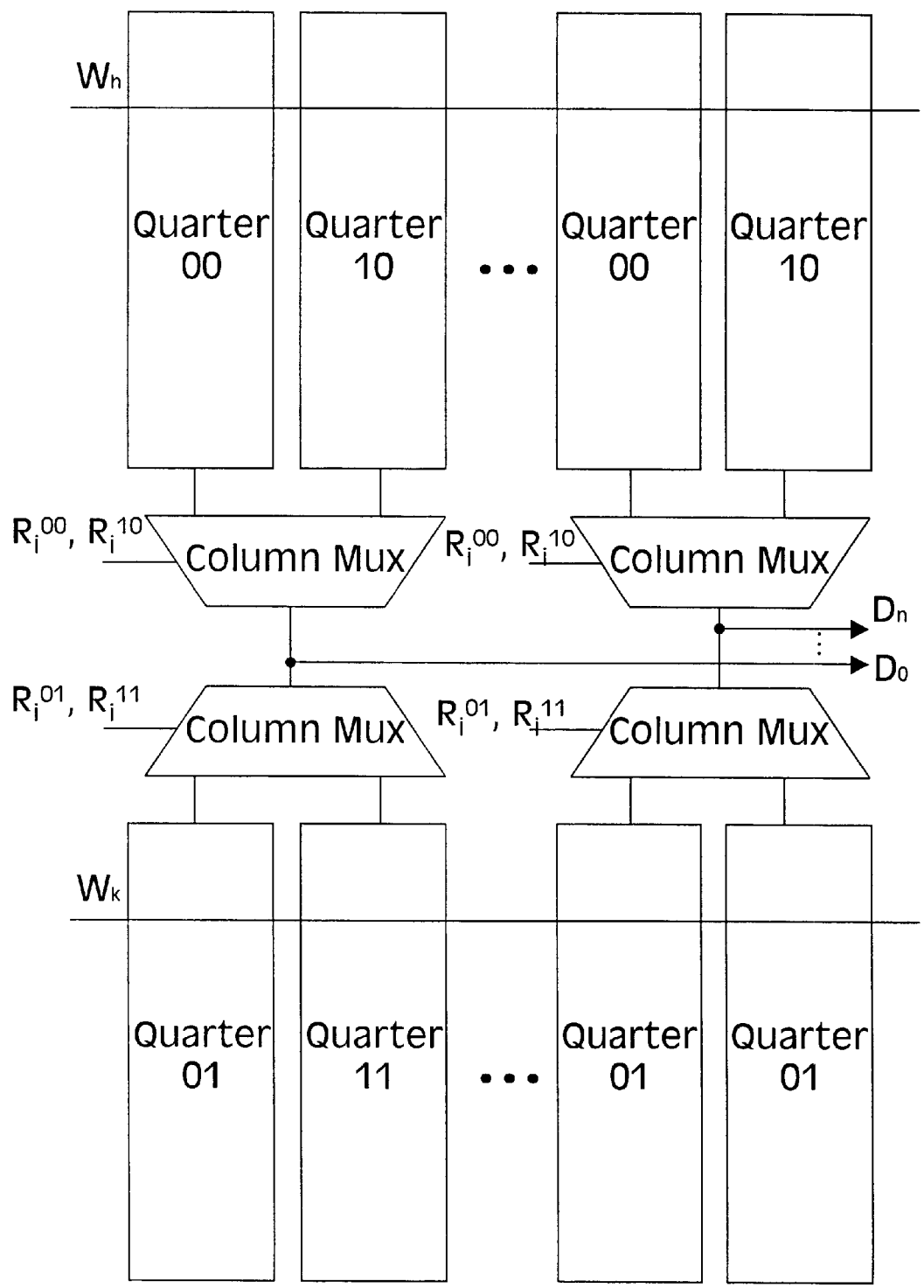
FIG. 12 shows one embodiment of a cache column multiplexing scheme using a grouping of addresses according to possible 2-bit subsequences.

With regard to FIG. 12, one embodiment of a cache column multiplexing scheme using a grouping of addresses according to possible 2-bit subsequences is disclosed. As was previously discussed, a bitline 1220 for a 0th data bit may be shared by quarter 00, illustrated as block 1200, and quarter 10, illustrated as block 1210 by directly using some ith possible subsequence indicators $R_i^{00}$ and $R_i^{10}$ as column selectors in column multiplexer 1240. Similarly, bitline 1220 for a 0th data bit may be shared by quarter 01, illustrated as block 1201, and quarter 11, illustrated as block 1211 by directly using ith possible subsequence indicators $R_i^{01}$ and $R_i^{11}$ as column selectors in column multiplexer 1250. Further considering a wordline $W_h$ produced by combining identified possible subsequences as described above but omitting from this combination the ith subsequence, this wordline being directly column selected by ith possible subsequence indicators $R_i^{00}$ and $R_i^{10}$; such a wordline differs in its i–1 th bit from a similarly produced wordline $W_k$ being directly column selected by ith possible subsequence indicators $R_i^{01}$ and $R_i^{11}$ and hence accesses a different physical storage location than wordline $W_k$. Therefore bitline 1220 may be shared as a common output of column multiplexer 1240 and column multiplexer 1250 without contention, providing a unique 0th data bit $D_0$ for line 1230.

Similarly, bitline 1229 may be shared as a common output of column multiplexer 1249 for an nth data bit shared by quarter 00, illustrated as block 1209, and quarter 10, illustrated as block 1219 by directly using ith possible subsequence indicators $R_i^{01}$ and $R_i^{11}$ as column selectors; and column multiplexer 1259 for an nth data bit shared by quarter 01, illustrated as block 1291, and quarter 11, illustrated as block 1299 by directly using ith possible subsequence indicators $R_i^{01}$ and $R_i^{11}$ as column selectors without contention, providing a unique nth data bit $D_n$ for line 1239.

Figure 13:
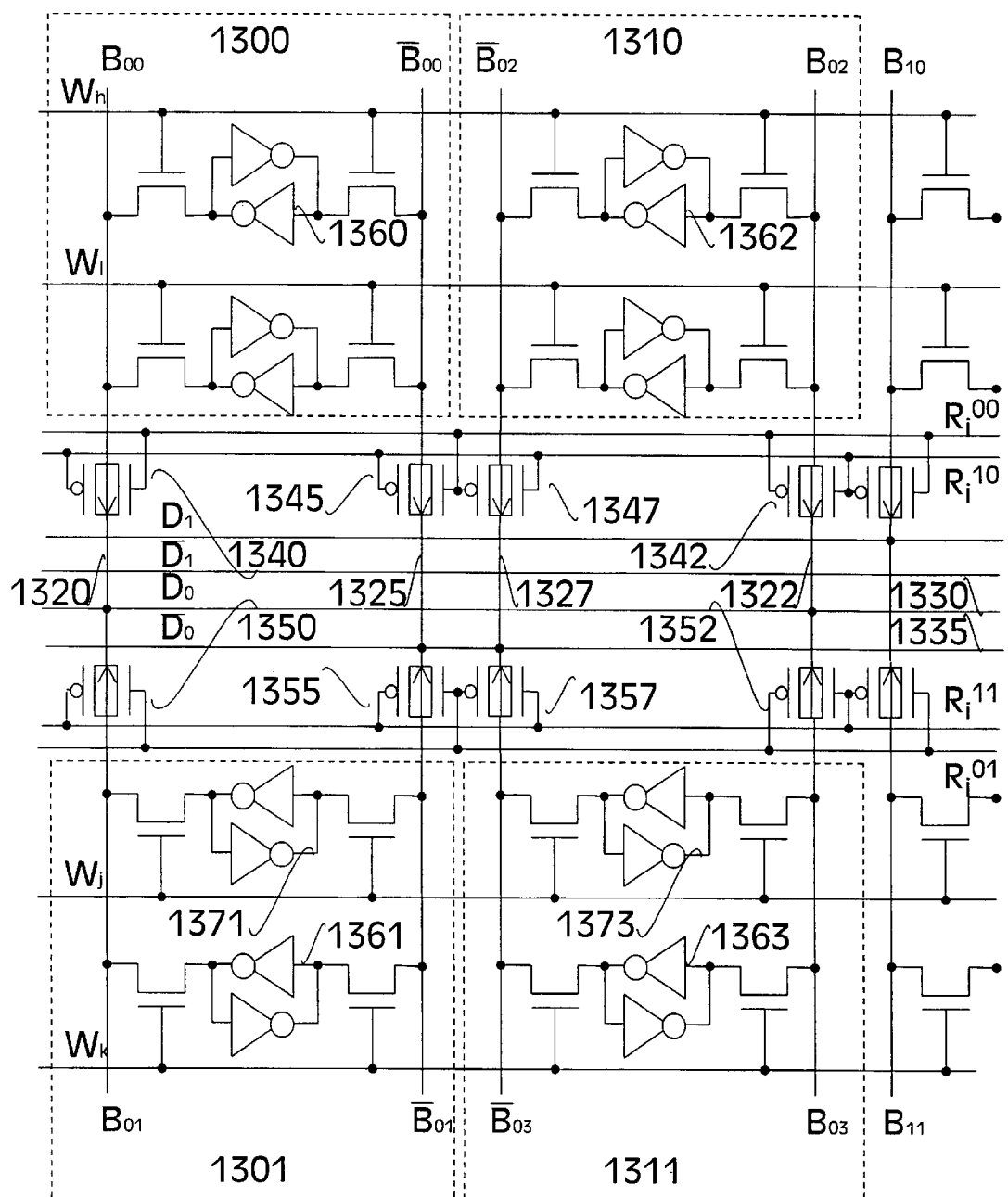
FIG. 13 details one embodiment of a cache column multiplexing scheme using a grouping of addresses according to possible 2-bit subsequences.

Details of one embodiment of a cache column multiplexing scheme using a grouping of addresses according to possible 2-bit subsequences is illustrated in FIG. 13. A bitline comprising line 1320 connected with line 1322 through line 1330, for a 0th data bit is shared by quarter 00, illustrated as block 1300, and quarter 10, illustrated as block 1310 by directly using some ith possible subsequence indicators $R_i^{00}$ and $R_i^{10}$ as column selectors in a column multiplexer comprising pass-gate device 1340 and pass-gate device 1342. Similarly, a bitline comprising line 1320 connected with line 1322 through line 1330, is shared by quarter 01, illustrated as block 1301, and quarter 11, illustrated as block 1311 by directly using ith possible subsequence indicators $R_i^{01}$ and $R_i^{11}$ as column selectors in a column multiplexer comprising pass-gate device 1350 and pass-gate device 1352.

A wordline $W_h$, produced by combining identified possible subsequences while omitting from this combination the ith subsequence, accesses storage cell 1360 to present a stored true logical value on bitline $B_{00}$ and a stored complemented logical value on bitline $B_{00}$ bar and also accesses storage cell 1362 to present a stored true logical value on bitline $B_{10}$ and a stored complemented logical value on bitline $B_{10}$ bar. This wordline being directly column selected by ith possible subsequence indicators $R_i^{00}$ and $R_i^{10}$ to multiplex either the true logical value on bitline $B_{00}$ onto line 1320 or the true logical value on bitline $B_{02}$ onto line 1322, differs in its i–1th bit from similarly produced wordlines $W_i$ and $W_k$ being directly column selected by ith possible subsequence indicators $R_i^{01}$ and $R_i^{11}$ and hence accesses a different physical storage location than wordlines $W_i$ or $W_k$. Therefore neither the storage cells 1361 and 1371 of block 1301 nor the storage cells 1363 and 1373 of block 1311 will be accessed and so the bitline comprising line 1320 connected with line 1322 through line 1330 may be shared as a common output of the column multiplexer comprising pass-gate device 1340 and pass-gate device 1342 and the column multiplexer comprising pass-gate device 1350 and pass-gate device 1352 without contention, providing a unique 0th true data bit $D_0$ for line 1330.

Similarly wordline $W_h$, being directly column selected by ith possible subsequence indicators $R_i^{00}$ and $R_i^{10}$ to multiplex either the complemented logical value on bitline $B_{00}$ bar onto line 1325 or the complemented logical value on bitline $B_{02}$ bar onto line 1327, accesses a different physical storage location than wordlines $W_i$ or $W_k$. Therefore the bitline comprising line 1325 connected with line 1327 through line 1335 may be shared as a common output of the column multiplexer comprising pass-gate device 1345 and pass-gate device 1347 and the column multiplexer comprising pass-gate device 1355 and pass-gate device 1357 without contention, providing a unique 0th complemented data bit $D_0$ bar for line 1335. It will be appreciated that the above description is intended to illustrate rather than restrict, and that real memory typically comprise further complexities such as equilibrium circuitry, cross coupled differential amplifiers, and write circuitry not shown in FIG. 13. It will also be appreciated that real memory typically involves many more wordlines, storage cells and perhaps more columns than those illustrated in FIG. 13.

Figure 14:
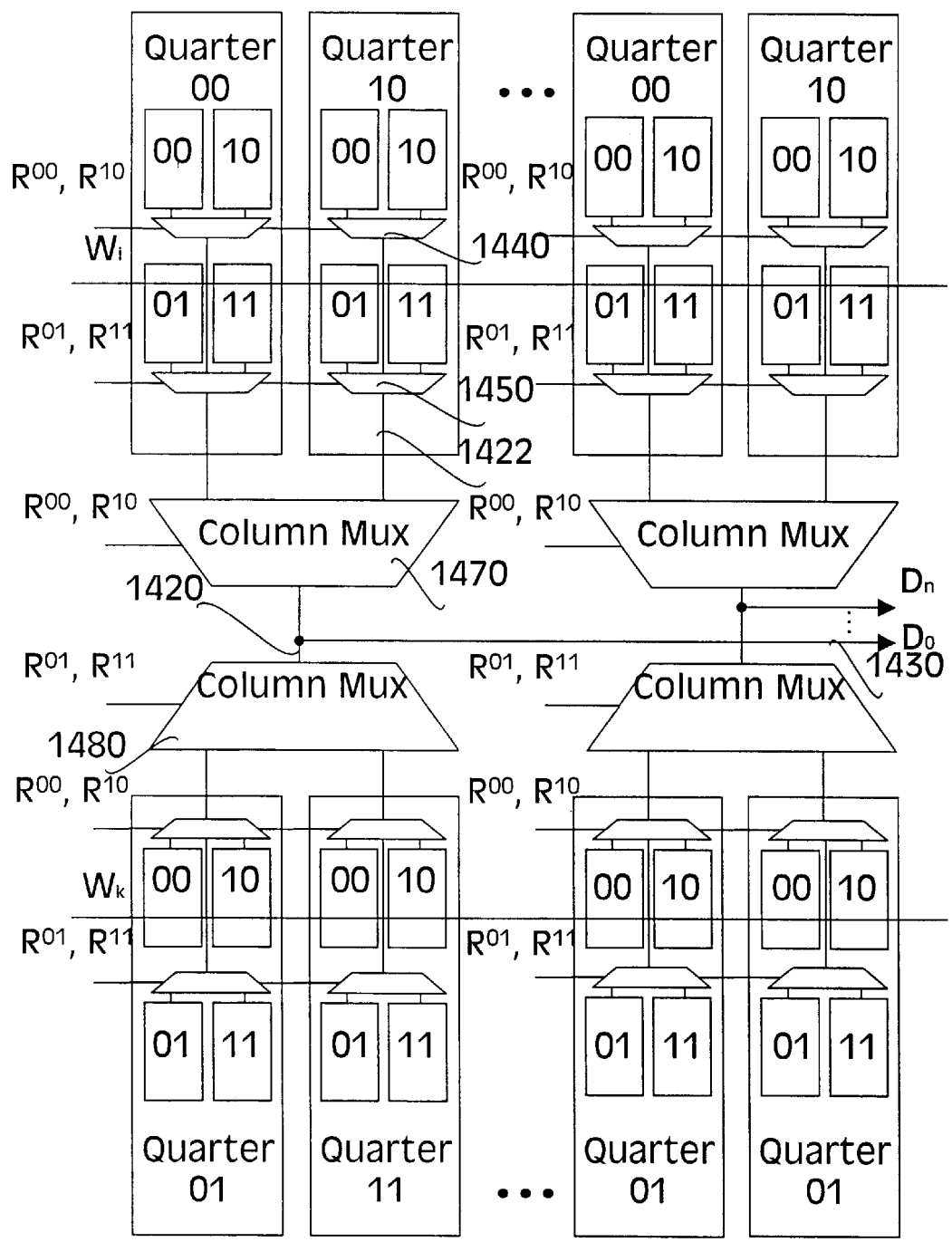
FIG. 14 shows one embodiment of a 2-level column multiplexing scheme using a grouping of addresses according to possible 2-bit subsequences.

FIG. 14 shows one embodiment of a 2-level column multiplexing scheme using a grouping of addresses according to a first set of possible 2-bit subsequence indicators, $(R_n^{11}, R_n^{01})$ and $(R_n^{10}, R_n^{00})$ and according to a second set of possible 2-bit subsequence indicators, $(R_m^{11}, R_m^{01})$ and $(R_m^{10}, R_m^{00})$ For example, a wordline $W_h$ produced by combining identified possible subsequences as described above but omitting from this combination the nth and mth subsequences, this wordline being directly column selected by nth possible subsequence indicators $R_n^{00}$ and $R_n^{10}$; such a wordline, differs in its n–1th bit from a similarly produced wordline $W_i$ being directly column selected by nth possible subsequence indicators $R_n^{01}$ and $R_n^{11}$ and hence accesses a different physical storage location than wordline $W_i$. Hence, a common output 1422 may be shared between column multiplexer 1440 and column multiplexer 1450 without contention, providing a unique 0th data bit $D_0$ for line 1422.

Further, wordline $W_h$ produced by combining identified possible subsequences as described above but omitting from this combination the nth and mth subsequences, this wordline also being directly column selected by mth possible subsequence indicators $R_m^{00}$ and $R_m^{10}$; such a wordline differs in its m–1th bit from a similarly produced wordline $W_k$ being directly column selected by mth possible subsequence indicators $R_m^{01}$ and $R_m^{11}$ and hence accesses a different physical storage location than wordline $W_k$. Hence, a common output 1420 may be shared between column multiplexer 1470 and column multiplexer 1480 without contention, providing a unique 0th data bit $D_0$ for line 1230.

Figure 15:
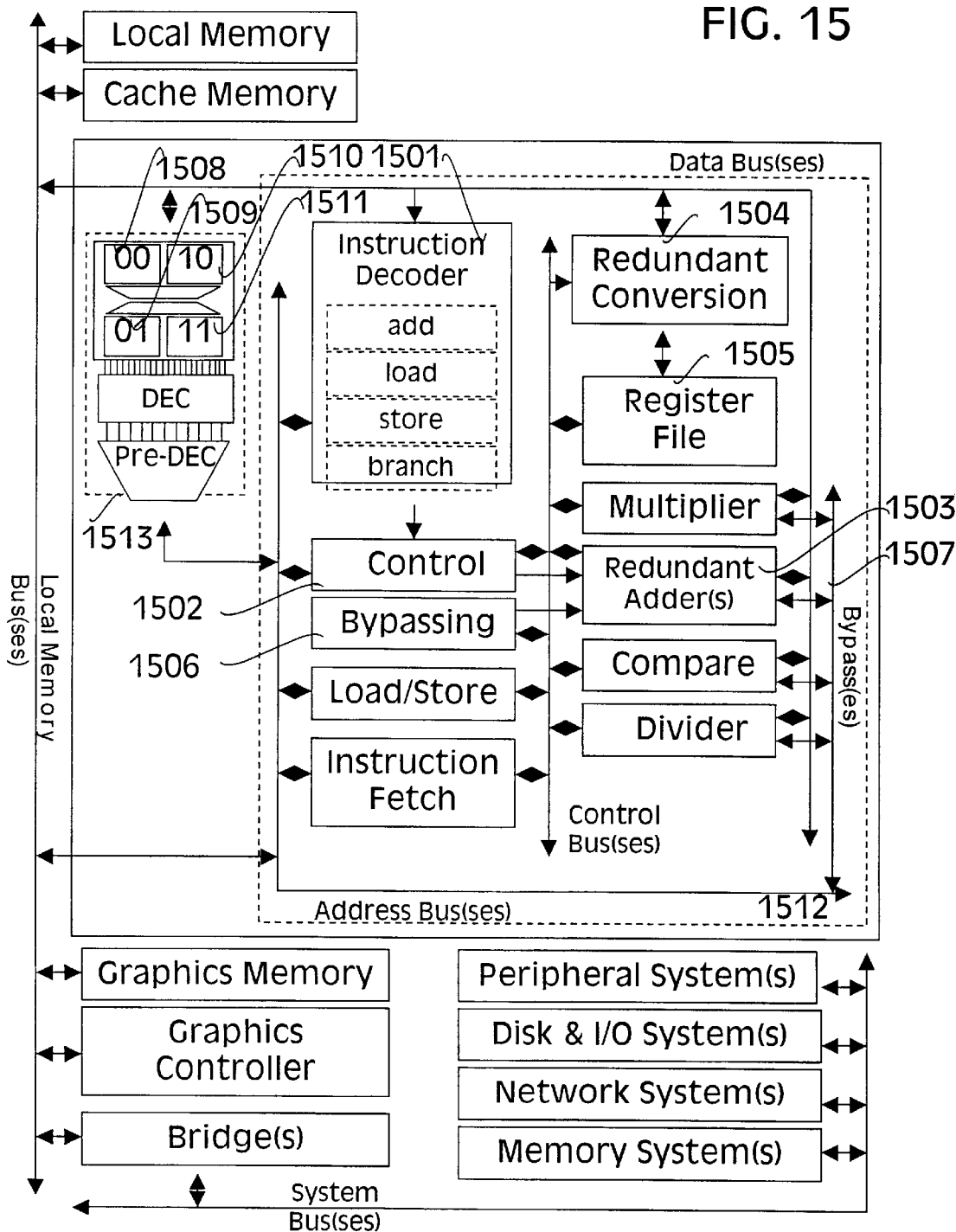
FIG. 15 shows one embodiment of a digital computing system that includes a cache column multiplexing scheme using a grouping of addresses according to possible 2-bit subsequences.

One embodiment of a digital computing system is shown in FIG. 15, which comprises a cache 1513 with a decoder for receiving redundant addresses and multiplexing bitlines according to possible subsequence indicators $R_i^{00}$ corresponding to block 1508, $R_i^{10}$ corresponding to block 1510, $R_i^{01}$ corresponding to block 1509, and $R_i^{11}$ corresponding to block 1511. For one embodiment, cache 1513, is the fastest internal cache in a hierarchical plurality of caches including slower external caches and 1513 is resident on the same die as processor, 1512. In another embodiment, cache 1513 and possibly other internal caches reside on the same die, but there are no external caches. In this context, an internal cache is one that resides on a die or chip with a processor core. An external cache is one that resides off the die, on a separate die or chip.

Instruction decoder, 1501, receives instructions that may include additions, loads, stores, etc. For example, a first instruction to add a base address in a first register to an index in a second register, writing the result in a third register may be received and decoded. Then a second instruction to load data from the address in the third register may be received and decoded. The first instruction may produce a result by providing operands from a register file, 1505, to a redundant adder, 1503. In order to complete the second instruction quickly, the result produced by redundant adder, 1503, may be bypassed to cache, 1513, by the bypassing control 1506. The redundant address received by cache 1513 may be processed by a pre-decoder to identify possible subsequences and activate possible subsequence indicators $R_i^{11}$, $R_i^{01}$, $R_i^{10}$ and $R_i^{00}$ for each ith bit position in the corresponding result address of the first instruction. A mth set of possible subsequence indicators $R_m^{11}$, $R_m^{01}$, $R_m^{10}$, and $R_m^{00}$ for an mth bit position in the corresponding result address of the first instruction, may be omitted from a combination of possible subsequence indicators to identify a wordline and activate a wordline indicator with which to access a particular wordline of storage locations in memory. The mth set of possible subsequence indicators $R_m^{11}$, $R_m^{01}$, $R_m^{10}$, and $R_m^{00}$ may instead be used directly as column selectors to multiplex four sets of bitlines corresponding to four 2-bit sequences at positions m and m−1 in the result address of the first instruction, said sets of bitlines being multiplexed into common outputs for presenting data values of each of the bit positions of the data associated with the result address of the first instruction.

Figure 16:
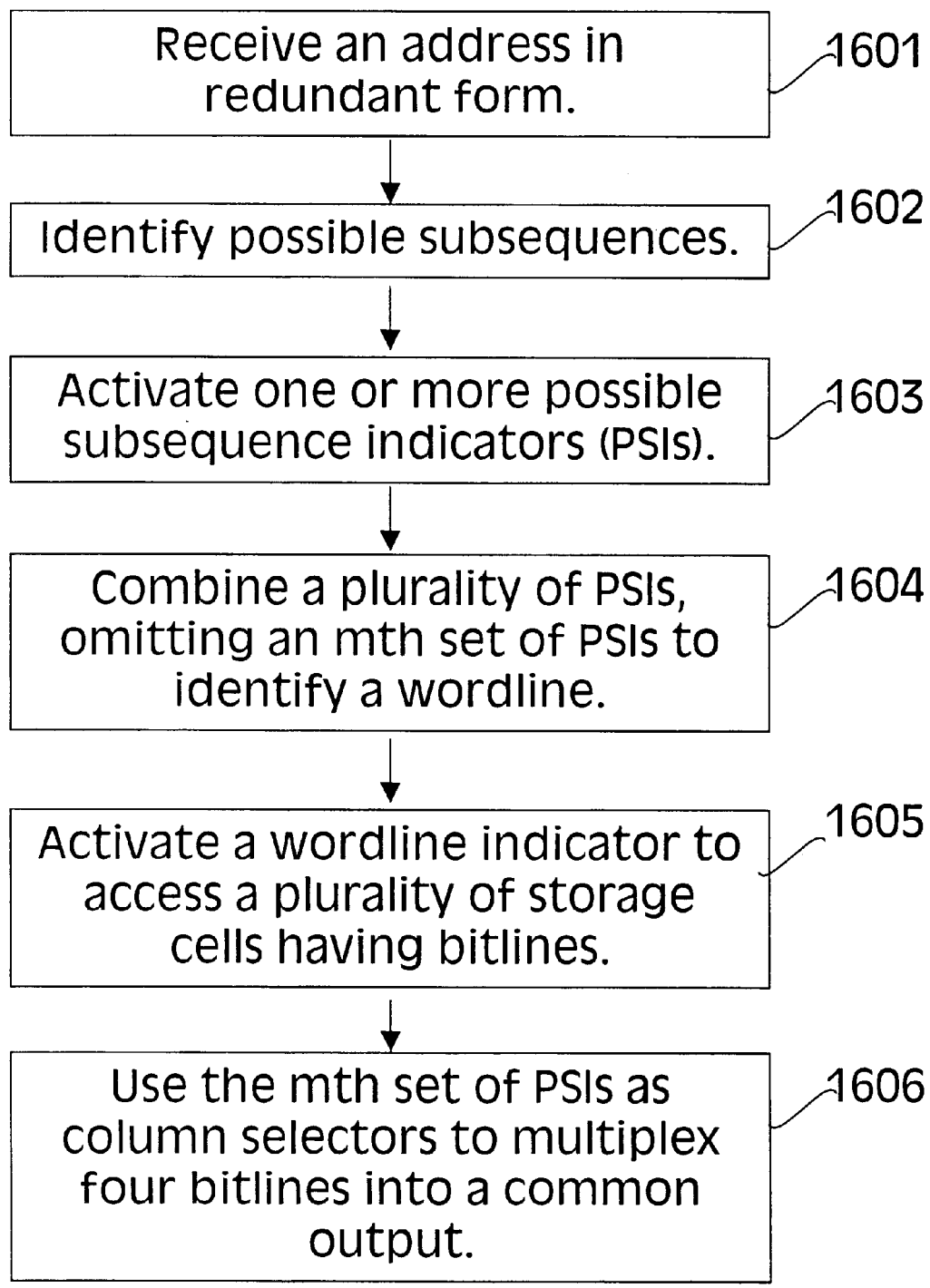
FIG. 16 shows one embodiment of a method of accessing data in a cache using redundant addresses.

FIG. 16 summarizes one embodiment of a method of accessing data in a cache using redundant addresses. The method comprises receiving a redundant address in block 1601 to access a storage location, and processing the redundant address to identify possible subsequences in block 1602. According to the possible sequences identified, possible subsequence indicators $R_i^{11}$, $R_i^{01}$, $R_i^{10}$, and $R_i^{00}$, are activated in block 1603 for each ith digit position in the redundant address. An mth set of possible subsequence indicators $R_m^{11}$, $R_m^{01}$, $R_m^{10}$, and $R_m^{00}$ for an mth digit position in the redundant address is omitted and remaining sets of possible subsequence indicators are combined to identify a wordline in block 1604. A wordline indicator with which to access a particular wordline of storage locations in memory is activated according to the wordline identified in block 1605. The mth set of possible subsequence indicators $R_m^{11}$, $R_m^{01}$, $R_m^{10}$, and $R_m^{00}$ is used directly as column selectors to multiplex four sets of bitlines into common outputs in block 1606, the bitlines corresponding to four 2-bit sequences at positions m and m−1 in a binary address corresponding to the redundant address. The common outputs present data values of each of the bit positions of the data stored at the location associated with the redundant address.

The above description is intended to illustrate preferred embodiments of the present invention. From the discussion above it should also be apparent that the invention can be modified in arrangement and detail by those skilled in the art without departing from the principles of the present invention within the scope of the accompanying claims.

What is claimed is:

1. An apparatus comprising:
   a plurality of storage locations associated with a plurality of bitlines;
   a pre-decoder to receive an address in redundant form and to identify one or more possible subsequences of bit values corresponding to each of a plurality of digit positions in the redundant address; and
   a first column multiplexer having a first bitline output, the first column multiplexer to receive a first plurality of data values on a first portion of the plurality of bitlines, and to select a first bitline having a first data value in response to a first identifier of the one or more possible subsequences of bit values identified.

2. The apparatus recited in claim 1 further comprising:
   a wordline decoder, from one or more of the identified possible subsequences of bit values, to identify a wordline and to access a first portion of the plurality of storage locations associated with the first portion of the plurality of bitlines.

3. The apparatus recited in claim 2 wherein the first identifier of the one or more possible subsequences of bit values identified is excluded from said one or more of the identified possible subsequences of bit values used to identify the wordline.

4. The apparatus recited in claim 1 wherein the address in redundant form is in a carry-sum redundant form.

5. The apparatus recited in claim 4 wherein the one or more possible subsequences of bit values identified include a subsequence of length two or more bits.

6. The apparatus recited in claim 5 wherein the one or more possible subsequences of bit values are identified according one or more of a plurality of logical relations equivalent to or including:

$$R_i^{11} = (S_{i-1} \text{ AND } C_{i-2}) \text{ XOR } (S_i \text{ XOR } C_{i-1}),$$

$$R_i^{01} = (S_{i-1} \text{ AND } C_{i-2}) \text{ XNOR } (S_i \text{ XOR } C_{i-1}),$$

$$R_i^{10} = (S_{i-1} \text{ OR } C_{i-2}) \text{ XOR } (S_i \text{ XOR } C_{i-1}),$$

and $$R_i^{00} = (S_{i-1} \text{ OR } C_{i-2}) \text{ XNOR } (S_i \text{ XOR } C_{i-1}).$$

7. The apparatus recited in claim 1 wherein the address in redundant form is in a sign-digit redundant form.

8. The apparatus recited in claim 7 wherein the one or more possible subsequences of bit values identified include a subsequence of length two or more bits.

9. The apparatus recited in claim 8 wherein the one or more possible subsequences of bit values are identified according to one or more of a plurality of logical relations equivalent to or including:

$$R_i^{11} = (X_{mi-1} \text{ NOR } (X_{mi-2} \text{ NAND NOT } X_{si-2})) \text{ XOR } (X_{mi} \text{ XOR } (X_{mi-1} \text{ NAND NOT } X_{si-1})),$$

$$R_i^{01} = \text{NOT } (X_{mi-1} \text{ NOR } (X_{mi-2} \text{ NAND NOT } X_{si-2})) \text{ XOR } (X_{mi} \text{ XOR } (X_{mi-1} \text{ NAND NOT } X_{si-1})),$$

$$R_i^{10} = (X_{mi-1} \text{ NAND } (X_{mi-2} \text{ NAND NOT } X_{si-2})) \text{ XOR } (X_{mi} \text{ XOR } (X_{mi-1} \text{ NAND NOT } X_{si-1})),$$

and $$R_i^{00} = \text{NOT } (X_{mi-1} \text{ NAND } (X_{mi-2} \text{ NAND NOT } X_{si-2})) \text{ XOR } (X_{mi} \text{ XOR } (X_{mi-1} \text{ NAND NOT } X_{si-1})).$$

10. The apparatus recited in claim 1 wherein the first identifier of the one or more possible subsequences of bit values identified corresponds to an identified possible subsequence having a length of two or more bits.

11. The apparatus recited in claim 10 wherein the first column multiplexer is coupled with the pre-decoder to receive a second identifier of the one or more possible subsequences of bit values identified, which is mutually exclusive of the first identifier of the one or more possible subsequences of bit values identified, and which indicates a bit value that is the same as a corresponding bit value indicated by the first identifier, the indicated bit value occurring in a least significant bit position of the possible subsequence identified by the second identifier.

12. The apparatus recited in claim 1 further comprising:
a second column multiplexer having a second bitline output, to receive a second plurality of data values on a second portion of the plurality of bitlines, and to select a second bitline having a second data value in response to a second identifier of the one or more possible subsequences of bit values identified.

13. The apparatus recited in claim 12 wherein the second column multiplexer is coupled to receive data from the first bitline output of the first column multiplexer.

14. The apparatus recited in claim 13 wherein the second identifier of the one or more possible subsequences of bit values identified indicates a bit value occurring in a bit position that does not correspond to a bit position in the possible subsequence identified by the first identifier.

15. The apparatus recited in claim 12 further comprising:
a common bitline output coupled with the first bitline output to receive the first data value from the first column multiplexer and coupled with the second bitline output to receive the second data value from the second column multiplexer.

16. The apparatus recited in claim 15 wherein the second identifier of the one or more possible subsequences of bit values identified indicates a bit value that is the same as a corresponding bit value indicated by the first identifier, the indicated bit value occurring in a most significant bit position of the possible subsequence identified by the second identifier.

17. The apparatus recited in claim 15 wherein the first data value and the second data value are not received as inverted signals.

18. A digital computing system comprising: a processor core; an internal cache having a first plurality of storage locations and a first plurality of corresponding bitlines including a first bitline on which to transmit a first data value;
a pre-decoder to receive an address in redundant form from the processor core and to identify one or more possible subsequences of bit values corresponding to each of a plurality of digit positions in the redundant address;
a first column multiplexer having a first bitline output, the first column multiplexer to receive a first plurality of data values on the first plurality of bitlines, and to select the first bitline in response to a first identifier of the one or more possible subsequences of bit values identified; and
an external cache having a second plurality of storage locations including a storage location to store a second data value, the external cache coupled with the internal cache, to transmit the second data value to the internal cache.

19. The digital computing system recited in claim 18 further comprising:
a wordline decoder to identify a wordline from one or more of the identified possible subsequences of bit values and to access the first plurality of storage locations of the internal cache.

20. The digital computing system recited in claim 19 wherein the first identifier of the one or more possible subsequences of bit values identified is excluded from said one or more of the identified possible subsequences of bit values used to identify a wordline.

21. A method comprising:
receiving an address in redundant form;
identifying a possible subsequence of bit values corresponding to the address received;
activating one or more possible subsequence indicators corresponding to the possible subsequence of bit values identified;
using a first possible subsequence indicator of the one or more possible subsequence indicators activated to select from a plurality of data sources a first data source from which to receive a first data value;
transmitting a data output value in response to the first data value received from the selected first data source.

22. The method recited in claim 21 further comprising:
activating a plurality of possible subsequence indicators associated with a plurality of digit positions in the address received;
combining the plurality of possible subsequence indicators activated to identify a wordline, the combined plurality of possible subsequence indicators excluding the first possible subsequence indicator;
in accordance with the identified wordline, activating the plurality of data sources to supply data values.

23. A cache memory system comprising:
a plurality of lines and columns for storing copies of memory storage locations having corresponding addresses;
means for decoding a first portion of an address to access a line of the cache memory system responsive to an access request that includes an address represented in a redundant form; and
means for decoding a second portion of the address represented in the redundant form into one or more indicators of possible subsequences of bit values to access a column of the cache memory system.

24. An apparatus comprising:
a pre-decoder to receive an address in a redundant form and to identify, from the redundant form of the address, one or more possible subsequences of values for bit positions in the address;
a wordline decoder, responsive to one or more of the identified possible subsequences of values, to identify a wordline to enable a plurality of bitlines associated with a plurality of storage locations; and
a first selector coupled with the pre-decoder and identified with a first one of the one or more possible subsequences of values for bit positions in the address to select a first bitline of the plurality of enabled bitlines when the first one of the one or more possible subsequences of values for bit positions in the address is identified by the pre-decoder.

25. The apparatus recited in claim 24 further comprising:
a second selector coupled with the pre-decoder, which is mutually exclusive of the first selector, and which indicates a value for a bit position in the address that is the same as a corresponding value indicated by the first selector, the second selector to select a second bitline of the plurality of enabled bitlines when a second one of the one or more possible subsequences of values for bit positions in the redundant address is identified by the pre-decoder.

26. The apparatus recited in claim 25 further comprising:

a first column multiplexer to receive data on the plurality of enabled bitlines, and coupled with the pre-decoder to output data from the first bitline responsive to the first selector and to output data from the second bitline responsive to the second selector.

27. The apparatus recited in-claim 26 further comprising:

a second column multiplexer coupled to an output of the first column multiplexer, and coupled with the pre-decoder to select the output of the first column multiplexer responsive to a third selector identified with a third one of the one or more possible subsequences of values for bit positions in the address.

* * * * *